United States Patent
Parthasarathy et al.

(10) Patent No.: US 6,930,027 B2
(45) Date of Patent: Aug. 16, 2005

(54) METHOD OF MANUFACTURING A SEMICONDUCTOR COMPONENT

(75) Inventors: Vijay Parthasarathy, Phoenix, AZ (US); Vishnu Khemka, Mesa, AZ (US); Ronghua Zhu, Chandler, AZ (US); Amitava Bose, Tempe, AZ (US); Todd Roggenbauer, Chandler, AZ (US); Paul Hui, Mesa, AZ (US); Michael C. Butner, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 206 days.

(21) Appl. No.: 10/369,874

(22) Filed: Feb. 18, 2003

(65) Prior Publication Data

US 2004/0161931 A1 Aug. 19, 2004

(51) Int. Cl.[7] .................................... H01L 21/425
(52) U.S. Cl. .................. 438/524; 438/221; 438/222; 438/223; 438/224; 438/229; 438/296; 438/424; 438/433; 438/694; 438/700; 438/706; 438/723; 438/724; 438/742; 438/745; 438/753
(58) Field of Search ........................... 438/221–224, 438/229, 296, 424, 433, 524, 706, 745, 723, 724, 742, 753

(56) References Cited

U.S. PATENT DOCUMENTS

| | | | |
|---|---|---|---|
| 5,298,450 A | | 3/1994 | Verret |
| 5,436,179 A | | 7/1995 | Erdeljac et al. |
| 5,691,232 A | | 11/1997 | Bashir et al. |
| 5,914,523 A | * | 6/1999 | Bashir et al. ............... 257/520 |
| 6,034,413 A | | 3/2000 | Hastings et al. |
| 6,110,797 A | | 8/2000 | Perry et al. |
| 6,214,696 B1 | | 4/2001 | Wu |
| 6,365,447 B1 | | 4/2002 | Hebert et al. |
| 6,399,449 B1 | | 6/2002 | Matsumoto |
| 6,667,226 B2 | * | 12/2003 | Pinto et al. ............... 438/524 |
| 2002/0081809 A1 | | 6/2002 | Pinto et al. |

OTHER PUBLICATIONS

Wolf, Silicon Processing for the VLSI Era, 2002, Lattice Press, vol. 4, pp. 313, 315.*
Moscatelli, et al., *LDMOS Implementation in a 0.35 μm BCD Technology (BCD6)*, 2000 Int'l Symp. on Power Semiconductor Devices 323.

* cited by examiner

Primary Examiner—Nadine G. Norton
Assistant Examiner—Eric B. Chen
(74) Attorney, Agent, or Firm—Bryan Cave LLP

(57) ABSTRACT

A method of manufacturing a semiconductor component includes forming a first electrically insulating layer (120) and a second electrically insulating layer (130) over a semiconductor substrate (110). The method further includes etching a first trench (140) and a second trench (150) through the first and second electrically insulating layers and into the semiconductor substrate, and etching a third trench (610) through a bottom surface of the second trench and into the semiconductor substrate. The third trench has a first portion (920) and a second portion (930) interior to the first portion. The method still further includes forming a third electrically insulating layer (910) filling the first trench and the first portion of the third trench without filling the second portion of the third trench, and also includes forming a plug layer (1010) in the second portion of the third trench.

27 Claims, 5 Drawing Sheets

US 6,930,027 B2

METHOD OF MANUFACTURING A SEMICONDUCTOR COMPONENT

FIELD OF THE INVENTION

This invention relates generally to semiconductor components, and relates more particularly to a method for manufacturing a semiconductor component.

BACKGROUND OF THE INVENTION

For many years, the market expectation for electronic components has been for continuing miniaturization. In an attempt to meet this expectation, designers and manufacturers of electronic components look for ways to decrease the spacing of transistors and other electronic devices on a chip. However, as electronic devices are brought into closer and closer proximity with each other, the problem of electronic interference between such devices becomes more pronounced. Deep trench isolation structures have been used to electrically isolate closely-spaced electronic devices on a chip, and deep trench processing is already common in such applications as dynamic random access memory (DRAM) and radio frequency (RE) combined bipolar and complementary metal-oxide semiconductor (BiCMOS) process flows. Yet existing processes for deep trench fabrication are not well suited to integration into a deep sub-micrometer shallow trench process when the deep trench is required to act as a high-voltage (approximately 50 volts and above) isolation structure. Such processes tend both to expose semiconductor wafers to excessive thermal budget and to interfere with or complicate the formation of shallow trench isolation (STI) structures. Accordingly, there exists a need for a method of manufacturing a high-voltage deep trench inside a shallow trench in deep sub-micrometer geometries, where the method of manufacturing reduces the thermal budget to which the semiconductor wafer is exposed and smoothly integrates the formation of deep trench structures into existing process modules with a minimal addition of new process steps. The manufacturing method should also be compatible with power integrated circuit (IC) technology, such that the manufactured semiconductor components which utilize the deep trench for isolation are capable of sustaining high voltages without breaking down.

BRIEF DESCRIPTION OF THE DRAWINGS

The invention will be better understood from a reading of the following detailed description, taken in conjunction with the accompanying figures in the drawings in which.

Figure 1:
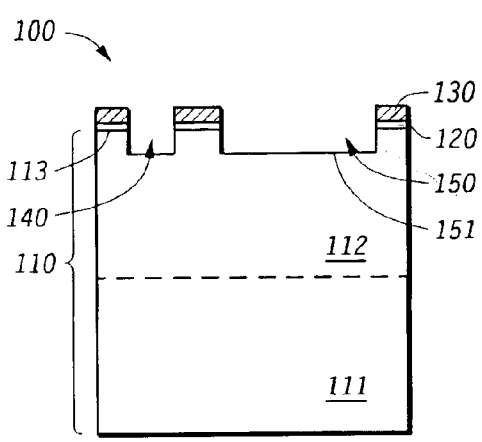
FIG. 1 is a cross sectional view of a portion of a semiconductor component at a particular point in a manufacturing process according to an embodiment of the invention.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner.

DETAILED DESCRIPTION OF THE DRAWINGS

In an embodiment of the invention disclosed herein, a method of manufacturing a semiconductor component includes providing a semiconductor substrate having an upper surface, forming a first electrically insulating layer over the upper surface, and forming a second electrically insulating layer over the first electrically insulating layer. The method further includes etching a first trench and a second trench through the first and second electrically insulating layers and into the semiconductor substrate, and etching a third trench through a bottom surface of the second trench and into the semiconductor substrate. The third trench has a first portion and a second portion interior to the first portion. The method still further includes forming a third electrically insulating layer filling the first trench and the first portion of the third trench without filling the second portion of the third trench, and also includes forming a plug layer in the second portion of the third trench.

Referring now to FIG. 1, which is a cross sectional view of a portion of a semiconductor component at a particular point in a manufacturing process according to an embodiment of the invention, a semiconductor component 100 comprises a semiconductor substrate 110, an electrically insulating layer 120 over semiconductor substrate 110, and an electrically insulating layer 130 over electrically insulating layer 120. Semiconductor substrate 110 can comprise a support substrate 111 and an epitaxial semiconductor layer 112 over support substrate 111. Semiconductor substrate 110 has an upper surface 113. Semiconductor component 100 further comprises a trench 140 and a trench 150. Trenches 140 and 150 extend through electrically insulating layers 120 and 130 and into semiconductor substrate 110. Trench 150 has a bottom surface 151. In one embodiment, trenches 140 and 150 may be etched so as to have depths that are substantially similar to each other, and trench 150 may be wider than trench 140. In the same or another embodiment, trench 140 is etched simultaneously with trench 150.

In one embodiment, semiconductor substrate 110 can comprise silicon. In a different embodiment, semiconductor substrate 110 can comprise a different semiconductor material. Electrically insulating layers 120 and 130 comprise electrically insulating materials. For example, in one embodiment, electrically insulating layer 120 can comprise an oxide material. For example, electrically insulating layer 120 can consist substantially of silicon dioxide, tetra-ethyl-ortho-silicate (TEOS), or phosphosilicate glass. In another embodiment, electrically insulating layer 120 can comprise a high dielectric constant material such as, for example, hafnium oxide. As a further example, electrically insulating layer 130 may, in one embodiment, comprise a nitride material such as, for example, silicon nitride or silicon oxy-nitride. Electrically insulating layers 120 and 130 may be comprised of different materials having different etch selectivities to different etchants. Electrically insulating layers 120 and 130 may be deposited in a chemical vapor deposition process or formed by some other method. Together, electrically insulating layers 120 and 130 comprise an active area stack. Electrically insulating layer 120 may provide stress relief for electrically insulating layer 130 in a manner known in the art.

In one embodiment, electrically insulating layer 120 can have a thickness of approximately 10–20 nanometers, while electrically insulating layer 130 can have a thickness of approximately 130–150 nanometers and trenches 140 and 150 can have a depth of approximately 340–360 nanometers. Trenches 140 and 150 may be formed in a standard patterning process in which a photolithographic etch mask is formed over upper surface 113 of semiconductor substrate 110 to define the locations of trenches 140 and 150.

Figure 2:
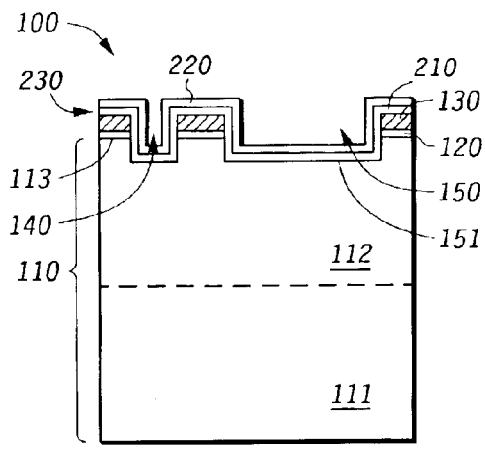
FIG. 2 is a cross sectional view of the semiconductor component of FIG. 1 at another point in the manufacturing process according to an embodiment of the invention.

Referring now to FIG. 2, which is a cross sectional view of semiconductor component 100 at another point in the manufacturing process according to an embodiment of the invention, semiconductor component 100 further comprises an electrically insulating layer 210 over electrically insulating layer 130 and in trenches 140 and 150. Semiconductor component 100 still further comprises an electrically insulating layer 220 over electrically insulating layer 210. Electrically insulating layers 210 and 220 can be similar to electrically insulating layers 120 and 130, respectively. As an example, electrically insulating layer 210 can be a silicon oxide layer, and electrically insulating layer 220 can be a silicon nitride layer. Electrically insulating layer 210, in one embodiment, acts as an oxide etch stop during a subsequently-described etching process. Electrically insulating layer 220 protects the active areas of semiconductor component 100 during a different subsequently-described etching process. Taken together, electrically insulating layers 210 and 220 can comprise a composite layer 230. In a particular embodiment, electrically insulating layer 210 is an approximately 15-nanometer-thick TEOS layer, and electrically insulating layer 220 is an approximately 17-nanometer-thick silicon nitride layer.

Figure 3:
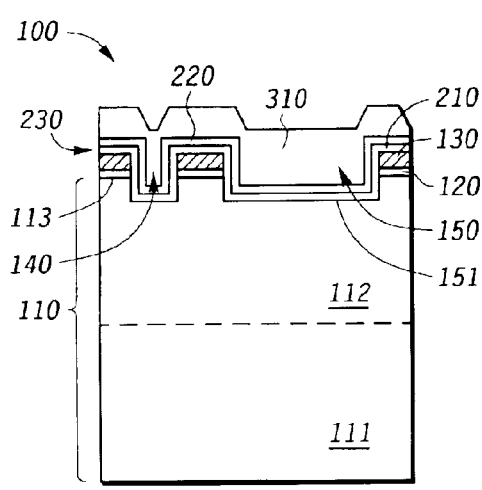
FIG. 3 is a cross sectional view of the semiconductor component of FIG. 2 at another point in the manufacturing process according to an embodiment of the invention.

Referring now to FIG. 3, which is a cross sectional view of semiconductor component 100 at another point in the manufacturing process according to an embodiment of the invention, semiconductor component 100 further comprises an electrically insulating layer 310 over electrically insulating layer 220. Electrically insulating layer 310 can be similar to electrically insulating layer 120 or 130. In one embodiment, electrically insulating layer 310 can be a silicon oxide layer. Electrically insulating layer 310 may act as an etch mask during subsequent etching steps. In a particular embodiment, electrically insulating layer 310 may comprise an oxide layer having a thickness of approximately 650 nanometers.

Figure 4:
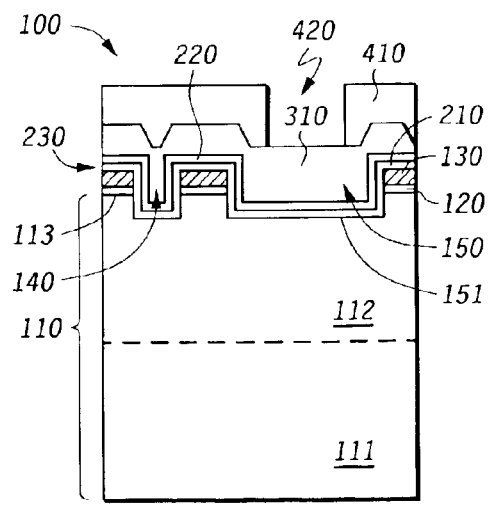
FIG. 4 is a cross sectional view of the semiconductor component of FIG. 3 at another point in the manufacturing process according to an embodiment of the invention.

Referring now to FIG. 4, which is a cross sectional view of semiconductor component 100 at another point in the manufacturing process according to an embodiment of the invention, a photolithographic etch mask 410 is formed over electrically insulating layer 310 to define a location for a subsequently-formed trench in semiconductor component 100. More specifically, photolithographic etch mask 410 is formed over those portions of electrically insulating layer 310 that are to remain in place during subsequent processing steps. Photolithographic etch mask 410 comprises a gap 420 over those portions of electrically insulating layer 310 where the subsequently-formed trench is to be located.

Figure 5:
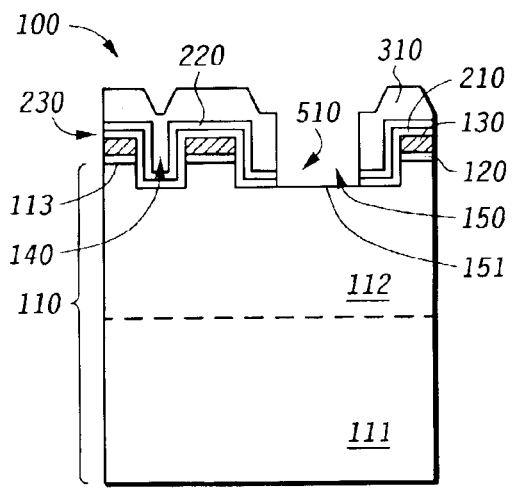
FIG. 5 is a cross sectional view of the semiconductor component of FIG. 4 at another point in the manufacturing process according to an embodiment of the invention.

Referring now to FIG. 5, which is a cross sectional view of semiconductor component 100 at another point in the manufacturing process according to an embodiment of the invention, an opening 510 is located in electrically insulating layer 310. Opening 510 is created by an etch process as known in the art, and opening 510 extends through electrically insulating layers 210 and 220 in addition to electrically insulating layer 310 and may extend into a portion of semiconductor substrate 110. As an example, opening 510 can be etched using dry etch techniques, including reactive ion etching (RIE), and/or wet etch techniques, including potassium hydride (KOH), tetra-methyl-ammonium-hydroxide (TMAH), and hydrofluoric acid (HF) or buffered HF. After opening 510 is formed, photolithographic etch mask 410 (FIG. 4) is stripped away, using a suitable process as known in the art, and semiconductor component 100 is cleaned, also using a suitable process as known in the art.

Figure 6:
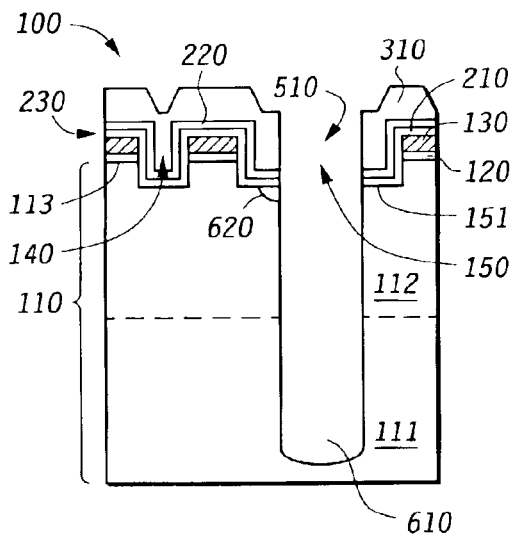
FIG. 6 is a cross sectional view of the semiconductor component of FIG. 5 at another point in the manufacturing process according to an embodiment of the invention.

Referring now to FIG. 6, which is a cross sectional view of semiconductor component 100 at another point in the manufacturing process according to an embodiment of the invention, semiconductor component 100 further comprises a trench 610 in semiconductor substrate 110. Trench 610 is etched through bottom surface 151 of trench 150, through epitaxial semiconductor layer 112, and into support substrate 111, using an etching technique such as is known in the art. Trench 610 may be formed with sloping sidewalls so as to facilitate subsequent processing steps for semiconductor component 100. In a particular embodiment, an angle 620 between bottom surface 151 of trench 150 and the sidewalls of trench 610 is approximately equal to ninety-two degrees rather than ninety degrees as in the case of a true vertical trench.

Figure 7:
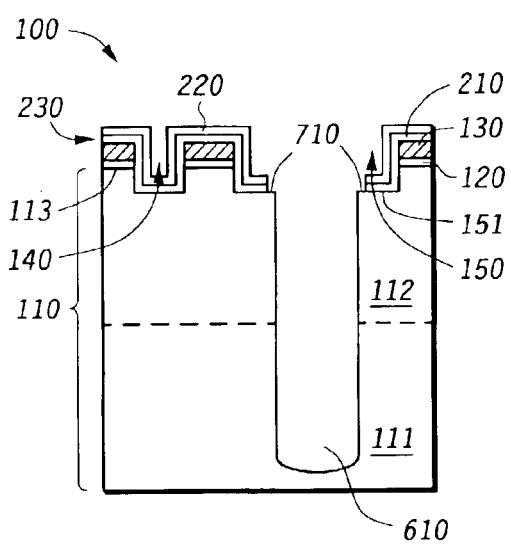
FIG. 7 is a cross sectional view of the semiconductor component of FIG. 6 at another point in the manufacturing process according to an embodiment of the invention.

Referring now to FIG. 7, which is a cross sectional view of semiconductor component 100 at another point in the manufacturing process according to an embodiment of the invention, it may be seen that electrically insulating layer 310 (FIG. 6) has been removed from semiconductor component 100. In one embodiment, all or substantially all of electrically insulating layer 310 may be removed using a buffered oxide etch (BOE) process. In a particular embodiment, the BOE process may have a duration of approximately 360 seconds. As a consequence of the removal of electrically insulating layer 310, electrically insulating layers 210 and 220 may be partially removed. As an example, portions of electrically insulating layers 210 and 220 located adjacent to trench 610 may be etched away by the etch process that removes electrically insulating layer 310, leaving ledges 710 in semiconductor component 100. It should be noted, however, that electrically insulating layers 210 and 220 protect electrically insulating layers 120 and 130 such that electrically insulating layers 120 and 130 are not affected by the etch process that removes electrically insulating layer 310 (FIG. 6).

Following the removal of electrically insulating layer 310 (FIG. 6), composite layer 230, in one embodiment, is removed using a suitable process as known in the art. As an example, composite layer 230 may be removed using an HF/hot phosphoric acid etch process. In another embodiment, composite layer 230 is not removed, but remains in trenches 140 and 150 throughout the rest of the process.

Figure 8:
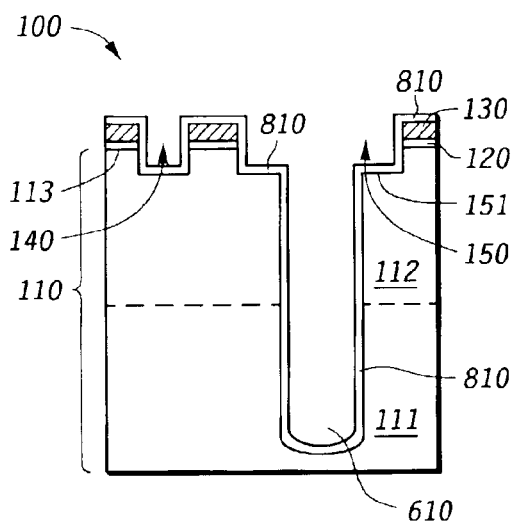
FIG. 8 is a cross sectional view of the semiconductor component of FIG. 7 at another point in the manufacturing process according to an embodiment of the invention.

Referring now to FIG. 8, which is a cross sectional view of semiconductor component 100 at another point in the manufacturing process according to an embodiment of the invention, semiconductor component 100 further comprises an electrically insulating layer 810 located over electrically insulating layer 130, in trench 140, in trench 150, and in trench 610. Because electrically insulating layer 810 is formed in trenches 140, 150, and 610 as part of a single processing step, the thermal budget as well as the number of steps necessary to form semiconductor component 100 are reduced compared to the thermal budget and the number of steps that would be needed if trenches 140, 150, and 610 were provided with their own electrically insulating layers in separate steps. In one embodiment, electrically insulating layer 810 comprises an oxide liner thermally grown in an oxidation furnace. In a particular embodiment, electrically insulating layer 810 can have a thickness of approximately 50 nanometers, and can be grown at approximately 1100 degrees Celsius as is often done in a non-volatile memory (NVM) process. In the same or another embodiment, electrically insulating layer 810 simultaneously lines trenches 140, 150, and 610.

Figure 9:
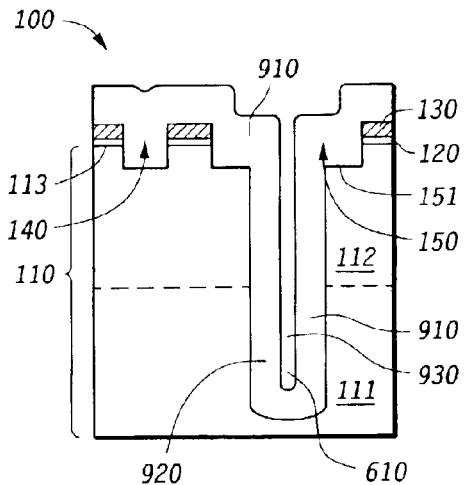
FIG. 9 is a cross sectional view of the semiconductor component of FIG. 8 at another point in the manufacturing process according to an embodiment of the invention.

Referring now to FIG. 9, which is a cross sectional view of semiconductor component 100 at another point in the manufacturing process according to an embodiment of the invention, semiconductor component 100 further comprises an electrically insulating layer 910 located over electrically insulating layer 810. One of ordinary skill in the art will understand that, after the deposition of layer 910, layers 810 and 910 merge and become indistinct. Accordingly, layer 810 is not separately illustrated in FIG. 9 or in subsequent figures. Electrically insulating layer 910 completely fills trenches 140 and 150, and fills a portion 920 of trench 610. Electrically insulating layer 910 does not fill a portion 930 of trench 610, located interior to portion 920. In one embodiment, electrically insulating layer 910 comprises a TEOS layer. In a particular embodiment, electrically insulating layer 910 may have a thickness of approximately 600 nanometers. The deposition of electrically insulating layer 910 may be followed by a standard 1000-degree Celsius densification process. Electrically insulating layer 910, in one embodiment, provides a field oxide in trench 610 that is capable of supporting more than 50 volts, thus making semiconductor component 100 compatible with high power IC technology.

Figure 10:
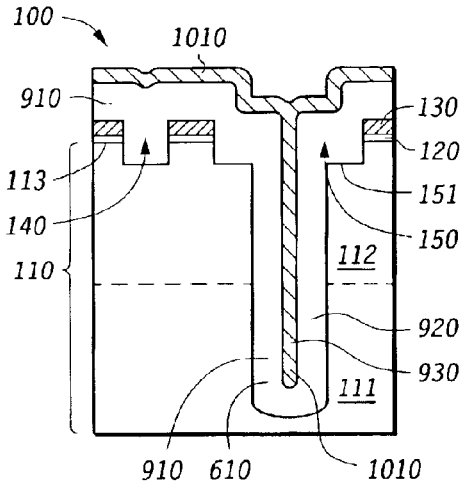
FIG. 10 is a cross sectional view of the semiconductor component of FIG. 9 at another point in the manufacturing process according to an embodiment of the invention.

Referring now to FIG. 10, which is a cross sectional view of semiconductor component 100 at another point in the manufacturing process according to an embodiment of the invention, semiconductor component 100 further comprises a plug layer 1010 located in portion 930 of trench 610. In one embodiment, plug layer 1010 comprises doped or undoped polysilicon. In a particular embodiment, electrically insulating layer 910 has a thickness of approximately 450 nanometers.

Figure 11:
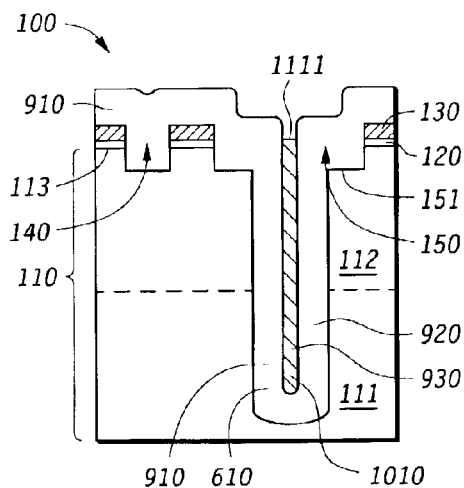
FIG. 11 is a cross sectional view of the semiconductor component of FIG. 10 at another point in the manufacturing process according to an embodiment of the invention.

Referring now to FIG. 11, which is a cross sectional view of semiconductor component 100 at another point in the manufacturing process according to an embodiment of the invention, plug layer 1010 has been recessed within trench 150, can be recessed below layer 130, and has been removed from all other areas of semiconductor component 100. In one embodiment, the recess and removal of plug layer 1010 may be accomplished by an etch process performed in a decoupled plasma source (DPS) chamber. In the same or another embodiment, plug layer 1010 can be etched without using an etch mask. In the embodiment illustrated in FIG. 11, plug layer 1010 is etched such that top surface 1111 protrudes above bottom surface 151 of trench 150. In the same or another embodiment, plug layer 1010 may be etched to form a top surface 1111 of plug layer 1010 below bottom surface 151 of trench 150. In the same or another embodiment, plug layer 1010 can be electrically biased.

Figure 12:
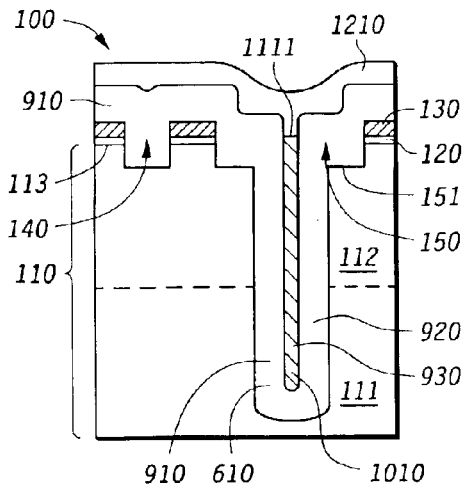
FIG. 12 is a cross sectional view of the semiconductor component of FIG. 11 at another point in the manufacturing process according to an embodiment of the invention.

Referring now to FIG. 12, which is a cross sectional view of semiconductor component 100 at another point in the manufacturing process according to an embodiment of the invention, an electrically insulating layer 1210 is formed over electrically insulating layer 910. Electrically insulating layer 1210 may comprise an oxide material. In a particular embodiment, electrically insulating layer 1210 is a TEOS layer and has a thickness of approximately 250 nanometers. In the same or a different embodiment, electrically insulating layer 1210 holds plug layer 1010 in place by sealing plug layer 1010 in trench 610, and isolates plug layer 1010 from external electrical connections. It will be understood that if trench 610 were filled with electrically insulating layer 910 only, the resulting stress on semiconductor component 100 would cause warping and other stress-related issues. Plug layer 1010 is used as a stress relief layer in order to mitigate such stress-related issues.

Figure 13:
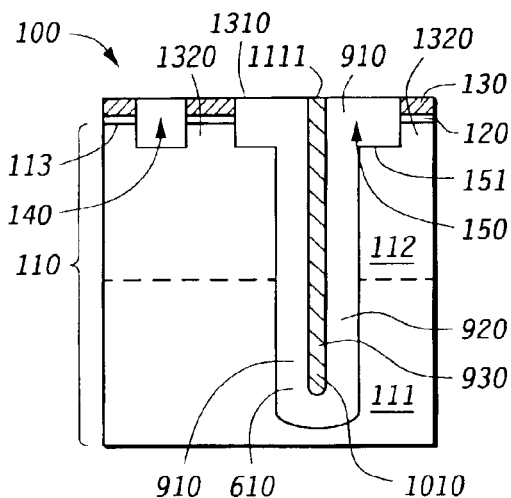
FIG. 13 is a cross sectional view of the semiconductor component of FIG. 12 at another point in the manufacturing process according to an embodiment of the invention.

Referring now to FIG. 13, which is a cross sectional view of semiconductor component 100 at another point in the manufacturing process according to an embodiment of the invention, semiconductor component 100 is shown following a planarizing process that removes electrically insulating layer 1210 (FIG. 12) and planarizes electrically insulating layer 910 across semiconductor component 100 such that a top surface 1310 of electrically insulating layer 910 and top surface 1111 of plug layer 1010 are substantially level or planar with electrically insulating layer 130. As an example, electrically insulating layer 1210 (FIG. 12) can be removed and electrically insulating layer 910 can be planarized using a chemical mechanical polishing (CMP) process as known in the art. As another example, electrically insulating layer 1210 is not deposited, and electrically insulating layer 910 can be planarized after plug 1010 is deposited and etched. In one embodiment, electrically insulating layer 910 can be planarized before plug layer 1010 is formed in portion 930 of trench 610.

Semiconductor component 100, in the same or another embodiment, can further comprise semiconductor devices 1320 in epitaxial semiconductor layer 112 of semiconductor substrate 110. The details of semiconductor devices 1320 are not shown in FIG. 13, but one skilled in the art will understand that semiconductor devices 1320 can be bipolar or field effect transistors. As an example, two of semiconductor devices 1320 can be separated by trenches 150 and 610. Semiconductor devices 1320 can be formed at various points in the manufacturing described herein, as is known in the art, but are preferably formed after the forming and filling of trenches 140, 150, and 610.

Figure 14:
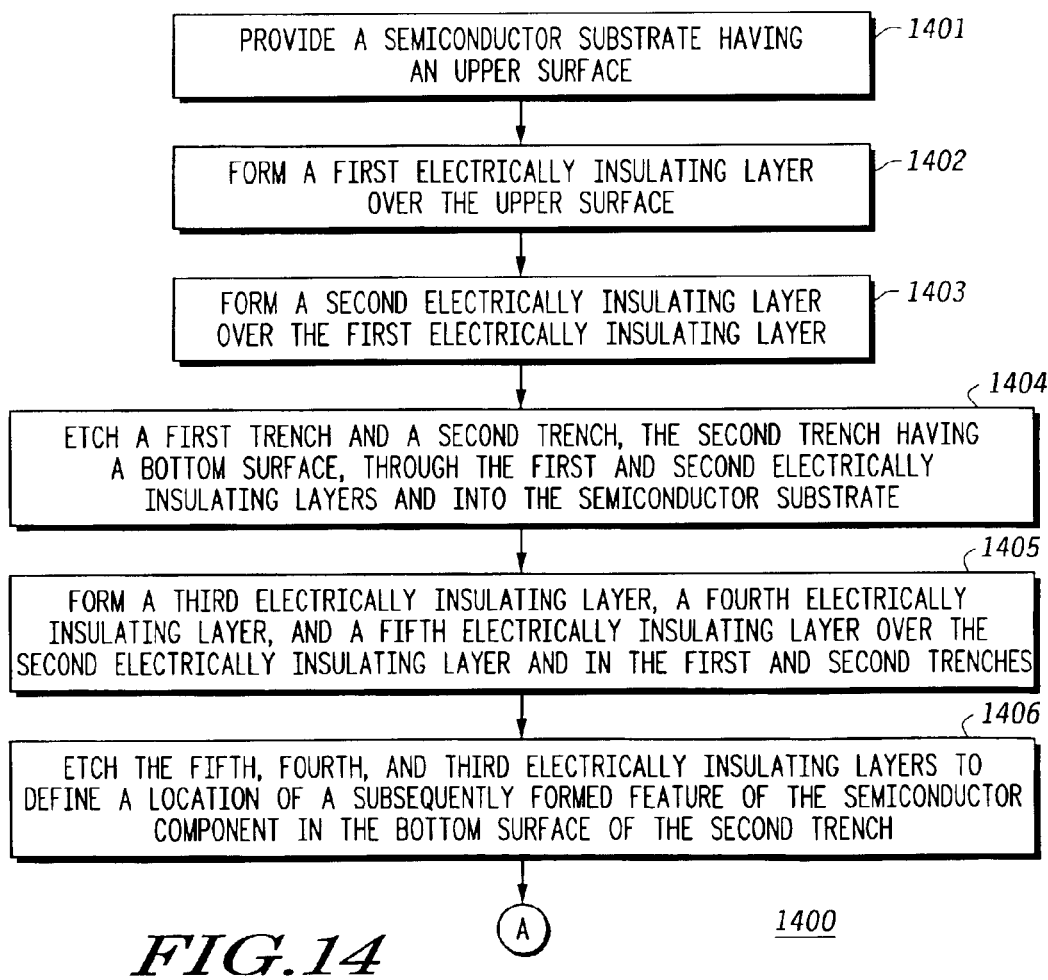
FIG. 14 is a flow chart illustrating a method of manufacturing a semiconductor component according to an embodiment of the invention.

Referring now to FIG. 14, which is a flow chart illustrating a method of manufacturing a semiconductor component according to an embodiment of the invention, a method 1400 is described. A step 1401 of method 1400 is to provide a semiconductor substrate having an upper surface. As an example, the semiconductor substrate can be similar to semiconductor substrate 110 in FIG. 1, and the upper surface can be similar to upper surface 113 in FIG. 1. In one embodiment, step 1401 further comprises providing a semiconductor substrate comprised of an epitaxial semiconductor layer over a support substrate. As an example, the epitaxial semiconductor layer can be similar to epitaxial semiconductor layer 112 in FIG. 1, and the support substrate can be similar to support substrate 111, also in FIG. 1. A step 1402 of method 1400 is to form a first electrically insulating layer over the upper surface. As an example, the first electrically insulating layer can be similar to electrically insulating layer 120 in FIG. 1. A step 1403 of method 1400 is to form a second electrically insulating layer over the first electrically insulating layer. As an example, the second electrically insulating layer can be similar to electrically insulating layer 130 in FIG. 1.

Referring still to FIG. 14, a step 1404 of method 1400 is to etch a first trench and a second trench, the second trench having a bottom surface, through the first and second electrically insulating layers and into the semiconductor substrate. As an example, the first trench can be similar to trench 140 in FIG. 1, and the second trench can be similar to trench 150, also in FIG. 1. A step 1405 of method 1400 is to form a third electrically insulating layer, a fourth electrically insulating layer, and a fifth electrically insulating layer over the second electrically insulating layer and in the first and second trenches. As an example, the third and fourth electrically insulating layers can be similar to electrically insulating layers 210 and 220, respectively, in FIG. 2, and the fifth electrically insulating layer can be similar to electrically insulating layer 310 in FIG. 3. A step 1406 of method 1400 is to etch the fifth, fourth, and third electrically insulating layers to define a location of a subsequently formed feature of the semiconductor component in the bottom surface of the second trench. Step 1406 is followed by a box A, representing a transition step from method 1400 to its continuation described in FIG. 15.

Figure 15:
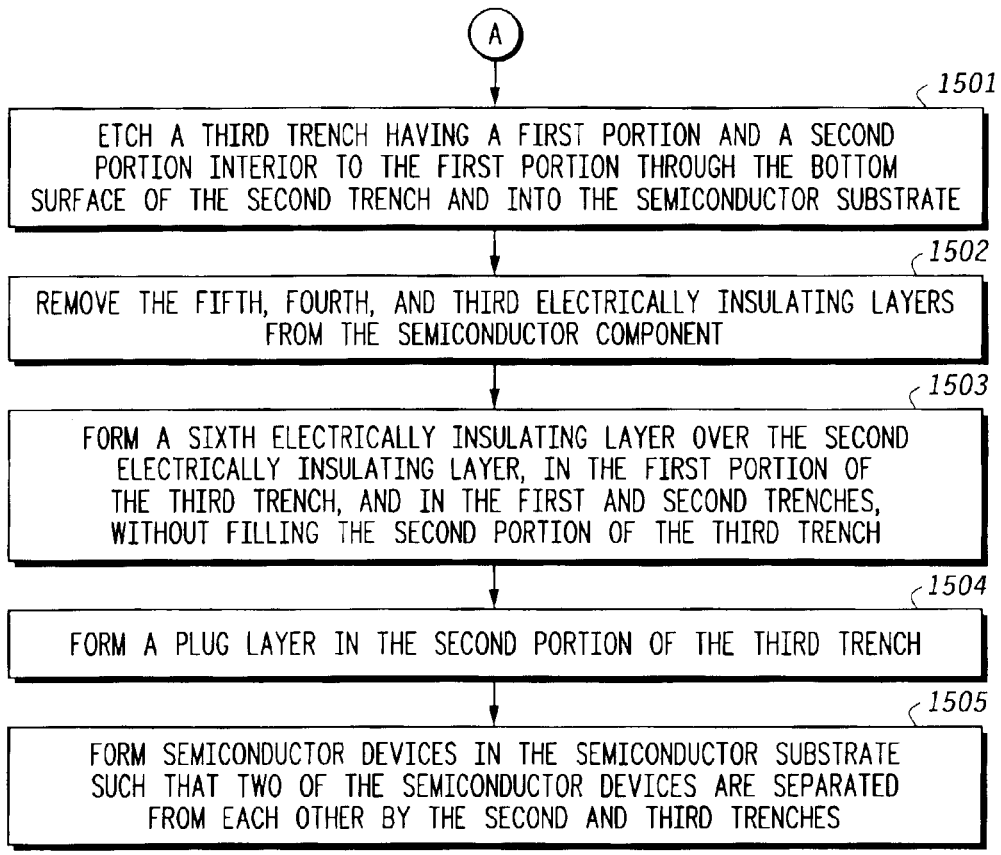
FIG. 15 is a flow chart illustrating a method of manufacturing a semiconductor component according to an embodiment of the invention.

Referring now to FIG. 15, which is a flow chart illustrating a method of manufacturing a semiconductor component according to an embodiment of the invention, a method 1500 is described. Method 1500 is a continuation of method 1400, described in FIG. 14, and begins at box A in FIG. 15. Box A in FIG. 15 represents the same transition step as that represented by box A in FIG. 14. A step 1501 of method 1500 is to etch a third trench having a first portion and a second portion interior to the first portion through the bottom surface of the second trench and into the semiconductor substrate. As an example, the third trench can be similar to trench 610 in FIG. 6, and the first and second portions can be similar to portions 920 and 930, respectively, in FIG. 9. A step 1502 of method 1500 is to remove the fifth, fourth, and third electrically insulating layers from the semiconductor component. A step 1503 of method 1500 is to form a sixth electrically insulating layer over the second electrically insulating layer, in the first portion of the third trench, and in the first and second trenches, without filling the second portion of the third trench. As an example, the sixth electrically insulating layer can be similar to electrically insulating layer 910 in FIG. 9. A step 1504 of method 1500 is to form a plug layer in the second portion of the third trench. As an example, the plug layer can be similar to plug layer 1010 in FIGS. 10 and 11. A step 1505 of method 1500 is to form semiconductor devices in the semiconductor substrate such that two of the semiconductor devices are separated from each other by the second and third trenches. As an example, the semiconductor devices can be similar to semiconductor devices 1320 in FIG. 13.

Although the invention has been described with reference to specific embodiments, it will be understood by those skilled in the art to which the invention pertains that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. To one of ordinary skill in the art it will be readily apparent that the invention discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims. Moreover, embodiments and limitations disclosed herein are not dedicated to the public under the doctrine of dedication if the embodiments and/or limitations: (1) are not expressly claimed in the claims and (2) are or are potentially equivalents of express elements and/or limitations in the claims under the doctrine of equivalents.

What is claimed is:

1. A method of manufacturing a semiconductor component, the method comprising:

providing a semiconductor substrate having an upper surface;

forming a first electrically insulating layer over the upper surface;

forming a second electrically insulating layer over the first electrically insulating layer;

etching a first trench and a second trench through the second electrically insulating layer and the first electrically insulating layer and into the semiconductor substrate, wherein the second trench comprises a bottom surface;

etching a third trench through the bottom surface of the second trench and into the semiconductor substrate, wherein the third trench has a first portion and a second portion interior to the first portion;

forming a third electrically insulating layer over the second electrically insulating layer, in the first portion of the third trench, and in the first trench, without filling the second portion of the third trench; and forming a plug layer in the second portion of the third trench, wherein:
forming the plug layer comprises etching the layer to form a top surface of the plug layer below the bottom surface of the second trench.

2. The method of claim 1 further comprising:
providing a fourth electrically insulating layer, a fifth electrically insulating layer, and a sixth electrically insulating layer over the second electrically insulating layer and in the first and second trenches; and
etching the fourth, fifth, and sixth electrically insulating layers to define a location of the third trench in the bottom surface of the second trench.

3. The method of claim 1 wherein:
forming the plug layer further comprises:
providing the plug layer comprised of polysilicon.

4. The method of claim 1 wherein:
forming the plug layer further comprises:
etching the plug layer without using an etch mask.

5. The method of claim 1 wherein:
etching the first trench and the second trench further comprises:
etching the first and second trenches to have the same depth.

6. The method of claim 1 wherein:
etching the first trench occurs simultaneously with etching the second trench.

7. The method of claim 1 further comprising:
depositing a fourth electrically insulating layer to fill the second trench; and
planarizing the third and fourth electrically insulating layers.

8. The method of claim 1 further comprising:
planarizing the third electrically insulating layer before forming the plug layer in the second portion of the third trench.

9. The method of claim 1 wherein:
the plug layer is electrically biased.

10. The method of claim 1 wherein:
providing the semiconductor substrate further comprises:
providing a semiconductor substrate comprised of an epitaxial semiconductor layer over a support substrate; and
etching the third trench further comprises:
etching the third trench through the bottom surface of the second trench, through the epitaxial semiconductor layer, and into the support substrate.

11. The method of claim 1 further comprising:
forming semiconductor devices in the semiconductor substrate, wherein:
two of the semiconductor devices are separated from each other by the third trench.

12. A method of manufacturing a semiconductor component, the method comprising:
providing a semiconductor substrate having an upper surface;
forming a first electrically insulating layer over the upper surface;
forming a second electrically insulating layer over the first electrically insulating layer;
etching a first trench and a second trench through the second electrically insulating layer and the first electrically insulating layer and into the semiconductor substrate, wherein the second trench comprises a bottom surface and is wider than the first trench;
forming a third electrically insulating layer, a fourth electrically insulating layer, and a fifth electrically insulating layer over the second electrically insulating layer and in the first and second trenches;
etching the third, fourth, and fifth electrically insulating layers to define a location of a third trench in the bottom surface of the second trench;
etching the third trench through the bottom surface of the second trench and into the semiconductor substrate, wherein the third trench has a first portion and a second portion interior to the first portion;
removing the third, fourth, and fifth electrically insulating layers;
forming a sixth electrically insulating layer in the first portion of the third trench and in the first trench such that the sixth electrically insulating layer fills the first trench without filling the second portion of the third trench; and
forming a plug layer in the second portion of the third trench such that the plug layer fills the second portion of the third trench.

13. The method of claim 12 wherein:
forming the plug layer further comprises:
forming the plug layer comprising a top surface; and
etching the plug layer without using an etch mask; and
etching the plug layer further comprises:
etching the top surface of the plug layer below the bottom surface of the second trench.

14. The method of claim 12 further comprising:
recessing the plug layer below the bottom surface of the second trench;
depositing a seventh electrically insulating layer to fill the second trench; and
planarizing the sixth and seventh electrically insulating layers.

15. The method of claim 12 further comprising:
planarizing the sixth electrically insulating layer before forming the plug layer in the second portion of the third trench.

16. The method of claim 12 wherein:
forming the plug layer comprises:
forming the plug layer such that a portion of the plug layer protrudes above the bottom surface of the second trench; and
the plug layer is electrically biased.

17. The method of claim 12 wherein:
providing the semiconductor substrate further comprises:
providing a semiconductor substrate comprised of an epitaxial semiconductor layer over a support substrate; and etching the third trench further comprises:
  etching the third trench through the bottom surface of the second trench, through the epitaxial semiconductor layer, and into the support substrate.

18. The method of claim 12 further comprising:
  forming semiconductor devices in the semiconductor substrate,
  wherein:
    two of the semiconductor devices are separated from each other by the third trench.

19. A method of manufacturing a semiconductor component, the method comprising:
  providing an epitaxial semiconductor layer over a support substrate, the epitaxial semiconductor layer having an upper surface;
  forming a first electrically insulating silicon oxide layer over the upper surface;
  forming a first electrically insulating silicon nitride layer over the first electrically insulating silicon oxide layer;
  etching a first trench and a second trench through the first electrically insulating silicon nitride layer, through the first electrically insulating silicon oxide layer, through the epitaxial semiconductor layer, and into the support substrate, wherein the second trench comprises a bottom surface and is wider than the first trench;
  forming a second electrically insulating silicon oxide layer, a second electrically insulating silicon nitride layer, and a third electrically insulating silicon oxide layer over the first electrically insulating silicon nitride layer and in the first and second trenches;
  etching the third electrically insulating silicon oxide layer, the second electrically insulating silicon nitride layer, and the second electrically insulating silicon oxide layer to define a location of a third trench in the bottom surface of the second trench;
  etching the third trench through the bottom surface of the second trench, through the epitaxial semiconductor layer, and into the support substrate, wherein the third trench has a first portion and a second portion interior to the first portion;
  removing the third electrically insulating silicon oxide layer and the second electrically insulating silicon nitride layer after etching the third trench;
  forming a fourth electrically insulating silicon oxide layer filling the first portion of the third trench and filling the first trench, without filling the second portion of the third trench, after removing the second and third electrically insulating silicon oxide layers and the second electrically insulating silicon nitride layer;
  forming a polysilicon plug layer in the second portion of the third trench such that the polysilicon plug layer fills the second portion of the third trench; and
  forming semiconductor devices in the epitaxial semiconductor layer,
  wherein:
    two of the semiconductor devices are separated from each other by the second and third trenches.

20. The method of claim 19 wherein:
  etching the first trench occurs simultaneously with etching the second trench.

21. The method of claim 20 wherein:
  etching the first trench and the second trench further comprises:
    etching the first and second trenches to have the same depth.

22. The method of claim 21 wherein:
  forming the polysilicon plug layer further comprises:
    etching the polysilicon plug layer without using an etch mask.

23. The method of claim 22 wherein:
  etching the polysilicon plug layer further comprises:
    etching the polysilicon plug layer to form a top surface of the polysilicon plug layer below the bottom surface of the second trench.

24. The method of claim 23 further comprising:
  depositing a fourth electrically insulating silicon oxide layer to fill the second trench.

25. The method of claim 24 further comprising:
  polishing the fourth electrically insulating silicon oxide layer to smooth the upper surface of the epitaxial semiconductor layer.

26. The method of claim 22 wherein:
  forming the polysilicon plug layer further comprises:
    forming the polysilicon plug layer such that a portion of the polysilicon plug layer protrudes above the bottom surface of the second trench.

27. The method of claim 26 wherein:
  the polysilicon plug layer is electrically biased.

* * * * *

UNITED STATES PATENT AND TRADEMARK OFFICE
CERTIFICATE OF CORRECTION

| | |
|---|---|
| PATENT NO. | : 6,930,027 B2 |
| APPLICATION NO. | : 10/369874 |
| DATED | : August 16, 2005 |
| INVENTOR(S) | : Vijay Parthasarathy |

It is certified that error appears in the above-identified patent and that said Letters Patent is hereby corrected as shown below:

In Column 9 of claim 1, line 17,

Delete "etching the layer" and replace with --etching the plug layer--

Signed and Sealed this

Twenty-second Day of May, 2007

JON W. DUDAS
*Director of the United States Patent and Trademark Office*